(12) United States Patent
Karmakar et al.

(10) Patent No.: US 10,930,332 B2
(45) Date of Patent: Feb. 23, 2021

(54) MEMORY ARRAY WITH INDIVIDUALLY TRIMMABLE SENSE AMPLIFIERS (71) Applicant: SPIN MEMORY, INC., Fremont, CA (US)

(72) Inventors: Susmita Karmakar, Fremont, CA (US); Neal Berger, Cupertino, CA (US); Mourad El Baraji, Fremont, CA (US); Benjamin Louie, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/520,162

(22) Filed: Jul. 23, 2019

(65) Prior Publication Data

US 2019/0348097 A1 Nov. 14, 2019

Related U.S. Application Data (63) Continuation of application No. 15/857,296, filed on Dec. 28, 2017, now Pat. No. 10,360,962.

(51) Int. Cl.
G11C 11/16 (2006.01)
G11C 7/08 (2006.01)
G11C 7/06 (2006.01)

(52) U.S. Cl.
CPC ............ G11C 11/1673 (2013.01); G11C 7/08 (2013.01); G11C 7/062 (2013.01); G11C 2207/002 (2013.01)

(58) Field of Classification Search
CPC .............................. G11C 11/1673; G11C 7/08
USPC .................................................. 365/158, 171
See application file for complete search history.

(56) References Cited

U.S. PATENT DOCUMENTS

| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,694,936 A | 11/1997 | Sakahima et al. |
| 5,695,846 A | 12/1997 | Lange et al. |

(Continued)

FOREIGN PATENT DOCUMENTS

| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

Primary Examiner — Son L Mai (57) ABSTRACT

A device includes an array of memory cells, input/output lines coupled to the memory cells, and sense amplifiers coupled to the input/output lines. Each sense amplifier is associated with a respective input/output line. The device also includes trim circuits. Each trim circuit is associated with and coupled to a respective sense amplifier. Each sense amplifier receives a respective reference voltage that allows the sense amplifier to sense a bit value of an addressed memory cell. Each trim circuit is operable for compensating for variations in the reference voltage used by the respective sense amplifier.

18 Claims, 7 Drawing Sheets (56) References Cited

U.S. PATENT DOCUMENTS

| | | | |
|---|---|---|---|
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 * | 2/2006 | Matsuoka | G11C 11/5678 365/148 |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 * | 11/2008 | Sakimura | G11C 11/15 365/158 |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,663,171 B2 | 2/2010 | Inokuchi et al. |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |

(56) References Cited

U.S. PATENT DOCUMENTS

| | | | |
|---|---|---|---|
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 * | 1/2012 | Tonomura | G11C 13/0004 365/148 |
| 8,102,701 B2 | 1/2012 | Prejbeanu et al. |
| 8,105,948 B2 | 1/2012 | Zhong et al. |
| 8,116,117 B2 * | 2/2012 | Cho | G11C 7/04 365/148 |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 * | 4/2012 | Fuse | G11C 5/147 323/313 |
| 8,159,867 B2 | 4/2012 | Cho et al. |
| 8,201,024 B2 | 6/2012 | Burger |
| 8,223,534 B2 | 7/2012 | Chung |
| 8,243,542 B2 * | 8/2012 | Bae | G11O 5/145 365/163 |
| 8,255,842 B2 | 8/2012 | Ipek |
| 8,278,996 B2 * | 10/2012 | Miki | G11C 5/147 327/103 |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 * | 12/2014 | Ha | G11C 8/10 365/148 |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 * | 9/2015 | Kim | G01R 31/2851 |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,806 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizama |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |

(56) References Cited

U.S. PATENT DOCUMENTS

| | | |
|---|---|---|
| 9,449,720 B1 | 9/2016 | Lung |
| 9,450,180 B1 | 9/2016 | Annuziata |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0181642 A1 | 7/2012 | Prejbeanu et al. |
| 2012/0188818 A1 | 7/2012 | Ranjan et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0078081 A1 | 3/2015 | Zhou et al. |
| 2015/0279904 A1 | 10/2015 | Pinarbasi et al. |
| 2016/0087193 A1 | 3/2016 | Pinarbasi et al. |
| 2016/0093375 A1 | 3/2016 | Srinivasan et al. |
| 2016/0163973 A1 | 6/2016 | Pinarbasi |
| 2016/0189784 A1 | 6/2016 | Tam et al. |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0047107 A1 | 2/2017 | Berger et al. |
| 2017/0062712 A1 | 3/2017 | Choi et al. |

(56) References Cited

U.S. PATENT DOCUMENTS

| | | |
|---|---|---|
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0352395 A1 | 12/2017 | Jan et al. |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kommeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| FR | 2910716 | 6/2008 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical investigation of Spin-Transfer Dynamics Using Perpendicular-to-Plane Polarizer", Applied Physics Letters, American Institute of Physics, vol. 86, (2005), pp. 022505-1 to 022505-3 (3 pages).

Kristen Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

Magnetic Technology Spintronics, Media and Interface, Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

| 802 |
| DETECT VARIATION IN REFERENCE BIT LINE VOLTAGE ASSOCIATED WITH A SENSE AMPLIFIER |

| 804 |
| DETERMINE A PROGRAM VALUE TO CONFIGURE A TRIM CIRCUIT FOR THE SENSE AMPLFIER |

| 806 |
| STORE THE PROGRAM VALUE, AND APPLY THE PROGRAM VALUE TO TRIM THE REFERENCE BIT LINE VOLTAGE |

MEMORY ARRAY WITH INDIVIDUALLY TRIMMABLE SENSE AMPLIFIERS

REFERENCE TO RELATED U.S. APPLICATION

This application is a continuation of the application with Ser. No. 15/857,296, now U.S. Pat. No. 10,360,962, entitled "Memory Array With Individually Trimmable Sense Amplifiers," by S. Karmakar, filed Dec. 28, 2017, and hereby incorporated by reference in its entirety.

BACKGROUND

Magnetoresistive random access memory (MRAM) is a non-volatile memory technology that stores data through magnetic storage elements. The elements are two ferromagnetic plates or electrodes that can hold a magnetic field and are separated by a non-magnetic material, such as a non-magnetic metal or insulator. This structure is known as a magnetic tunnel junction (MTJ). MRAM devices are considered to be a next generation structure for a wide range of memory applications.

Figure 1:
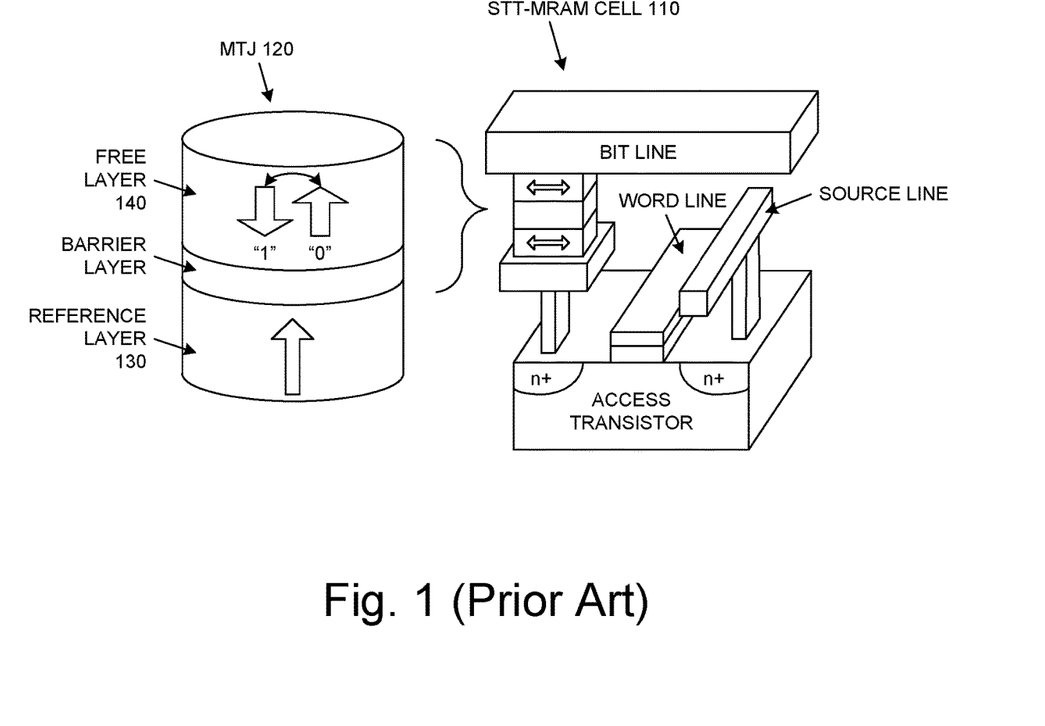
FIG. 1 illustrates an example of a conventional magnetoresistive random access memory cell.

FIG. 1 illustrates an example of an MRAM cell 110 including an MTJ 120. In general, one of the plates (a reference layer or fixed layer 130) has its magnetization pinned, meaning that this layer has a higher coercivity than the other layer and requires a larger magnetic field or spin-polarized current to change the orientation of its magnetization. The second plate is typically referred to as the free layer 140 and its magnetization direction can be changed by a smaller magnetic field or spin-polarized current relative to that of the reference layer 130. The two plates can be sub-micron in lateral size, and the magnetization direction can still be stable with respect to thermal fluctuations.

MRAM devices can store information by changing the orientation of the magnetization of the free layer 140. In particular, based on whether the free layer 140 is in a parallel or anti-parallel alignment relative to the reference layer 130, either a binary value of "1" or a binary value of "0" can be stored in the MRAM cell 110 as represented in FIG. 1.

MRAM products based on spin transfer torque switching, or spin transfer switching, are already making their way into larger data storage devices. Spin transfer torque MRAM (STT-M RAM) devices, such as the one illustrated in FIG. 1, use spin-aligned (polarized) electrons to change the magnetization orientation of the free layer in the magnetic tunnel junction. In general, electrons possess a quantized number of angular momentum intrinsic to the electron referred to as spin. An electrical current is generally unpolarized; that is, it consists of 50% spin-up and 50% spin-down electrons. By passing a current though a magnetic layer, electrons are polarized with a spin orientation corresponding to the magnetization direction of the magnetic layer (e.g., polarizer), thereby producing a spin-polarized current. If the spin-polarized current is passed to the magnetic region of the free layer 140 in the MTJ device, the electrons will transfer a portion of their spin-angular momentum to the magnetization layer to produce a torque on the magnetization of the free layer. This spin transfer torque can switch the magnetization of the free layer 140, which in effect writes either a "1" or a "0" based on whether the free layer is in the parallel or anti-parallel state relative to the reference layer 130.

Due to the spin-polarized electron tunneling effect, the electrical resistance of the cell changes due to the orientation of the magnetic fields of the two layers 130 and 140. The electrical resistance is typically referred to as tunnel magnetoresistance (TMR), which is a magnetoresistance effect that occurs in an MTJ. The cell's resistance will be different for the parallel and anti-parallel states, and thus the cell's resistance can be used to distinguish between a "1" and a "0."

Generally speaking, to read a memory cell, a current is applied to the bit line that includes that cell (the "main bit line") to detect the value of the cell's resistance by monitoring the voltage across the cell. A sense amplifier is used to sense the voltage level on the main bit line and compare it to a reference bit line voltage. The reference bit line voltage is established at a level that is between the main bit line voltage that corresponds to a bit value of 1 and the main bit line voltage that corresponds to a bit value of 0. If the main bit line voltage is greater than the reference bit line voltage, then a "1" is stored in the cell; and if the main bit line voltage is less than the reference bit line voltage, then a "0" is stored in the cell.

There is a sense amplifier for each bit line. Thus, for example, for a 32-bit read, 32 sense amplifiers are used. Ideally, the sense amplifiers would be identical, but often there is a mismatch between them due to variations in circuit parameters deriving from manufacturing process, layout, position in the memory array, and location of the ground. These mismatches can result in erroneous reads.

Figure 2A:
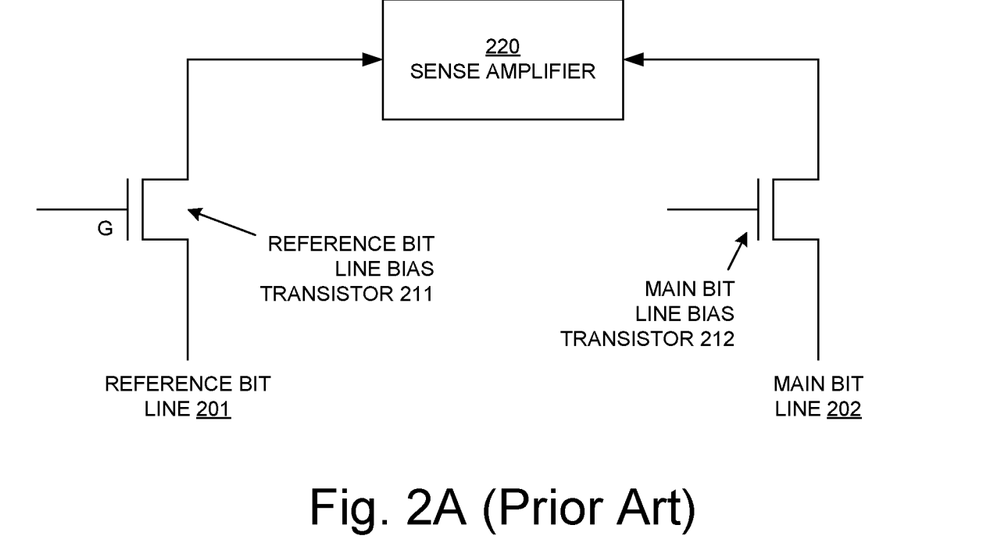
FIG. 2A illustrates an example of a conventional memory device including a sense amplifier coupled to a reference bit line and to a main bit line.
Figure 2B:
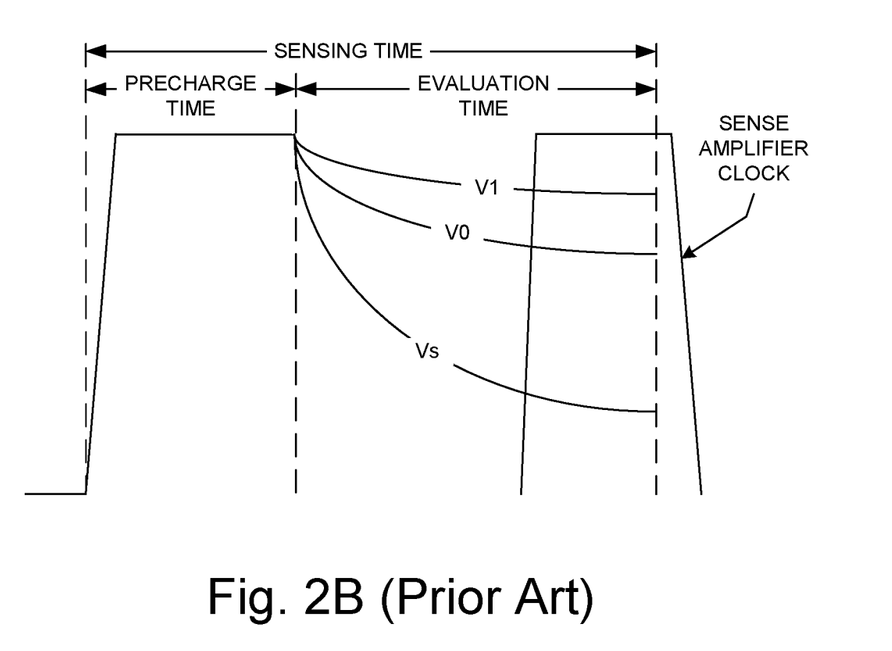
FIG. 2B illustrates an example of voltages versus time for an erroneous read operation in a conventional memory device.

This problem is illustrated by the example of FIGS. 2A and 2B. A reference bit line bias transistor 211 is connected to the reference bit line 201, and a main bit line bias transistor 212 is connected to the main bit line 202 of a memory cell being read. As illustrated in FIG. 2B, during the clock period of the sense amplifier 220, the reference bit line voltage supplied to the sense amplifier (Vs) is less than both the voltage (V1) that corresponds to a bit value of 1 and the voltage (V0) that corresponds to a bit value of 0 due to circuit parameter mismatch between the main bit line and the reference bit line. Thus, regardless of the actual bit value (0 or 1) stored by the memory cell that is being read, the sense amplifier 220 will sense a bit value of 1. That is, even if the actual stored bit value is 0, the sense amplifier 220 may erroneously sense a bit value of 1.

In an MTJ device, the difference between the main bit line voltage corresponding to a "1" and that corresponding to a "0" (the sensing margin) is small because the bit line resistance in series reduces the resistance ratio of the MTJs as seen by the sense amplifier. Also, a bias across an MTJ reduces the MTJ's resistance, especially the resistance of the anti-parallel state, and so TMR is reduced relative to the case of zero bias. Reduced TMR further decreases the sensing margin, which increases the possibility of an erroneous read. Thus, because of the relatively small sensing margin in MTJ devices, the problem of mismatches due to variations in circuit parameters and reference bit line voltage is particularly acute.

SUMMARY

Embodiments according to the present invention include a memory device that includes an array of memory cells, input/output lines (e.g., bit lines) coupled to the memory cells, and sense amplifiers coupled to the input/output lines. Each sense amplifier is associated with a respective input/output line. The device also includes trim circuits. Each trim circuit is associated with and coupled to a respective sense amplifier. Each sense amplifier receives a respective reference voltage that allows the sense amplifier to sense a bit value of an addressed memory cell. Each trim circuit is operable for independently compensating for variations in the reference voltage used by the respective sense amplifier.

In an embodiment, the memory cells include magnetoresistive random access memory (MRAM) cells, and the MRAM cells include magnetic tunnel junction (MTJ) memory cells.

In some embodiments, each trim circuit includes a number of transistors coupled to a ground and selectively coupled to a line that is coupled to a respective sense amplifier. In an embodiment, the trim circuit is coupled to a reference bit line that is coupled to the sense amplifier through a respective bit line bias transistor. In another embodiment, the trim circuit is coupled to a bit line bias line that is coupled to a respective bit line bias transistor that is coupled to a respective reference bit line that is coupled to the sense amplifier. In some of these embodiments, each trim circuit also includes a selection circuit that is coupled to the transistors and that is operable for selectively coupling one or more of the transistors to the line and for selectively decoupling one or more of the transistors from the line. In an embodiment, the transistors in the trim circuits have sizes that differ from each other by a factor of two.

In other embodiments, each trim circuit includes a variable resistor that is coupled to a supply voltage and that is also coupled to a reference bit line that is coupled to a respective sense amplifier.

Embodiments according to the present invention also include a method for configuring a trim circuit in a memory array. For each sense amplifier coupled to the memory array, a variation in an associated reference bit line voltage that places the associated reference bit line voltage outside a range of voltage values is detected; a respective program value to configure the respective programmable trim circuit to compensate for the variation is determined; and the respective program value is stored. When the program value is applied to configure a respective trim circuit, the associated reference bit line voltage is compensated so that it is within the range of voltage values. For example, the program value can be used to select (enable or disable) a number of transistors in a trim circuit or to select an amount of resistance in a trim circuit coupled to the sense amplifier.

In summary, embodiments according to the present invention use a trim circuit per sense amplifier to compensate for variations in the respective reference bit line voltage supplied to the sense amplifier. As a result, the reference bit line voltage supplied to each sense amplifier is maintained between the voltage associated with a bit value of 1 and the voltage associated with a bit value of 0. Mismatches between sense amplifiers are thereby compensated for or precluded. Consequently, the accuracy and reliability of read operations are increased. Specifically, erroneous reads due to mismatches in circuit parameters and variations in the reference bit line voltages are reduced in number if not completely eliminated, even when the sensing margin is small as it is for MTJ devices in MRAM arrays.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "reading," "programming," "detecting," "determining," "storing," "applying," or the like, refer to actions and processes (e.g., the flowchart 800 of FIG. 8) of a computing system or similar electronic computing device or hardware processor (e.g., the system 900 of FIG. 9). The computing system or similar electronic computing device manipulates and transforms data represented as physical (electronic) quantities within the computing system memories, registers or other such information storage, transmission or display devices.

Memory Array with Individually Trimmable Sense Amplifiers

Figure 3A:
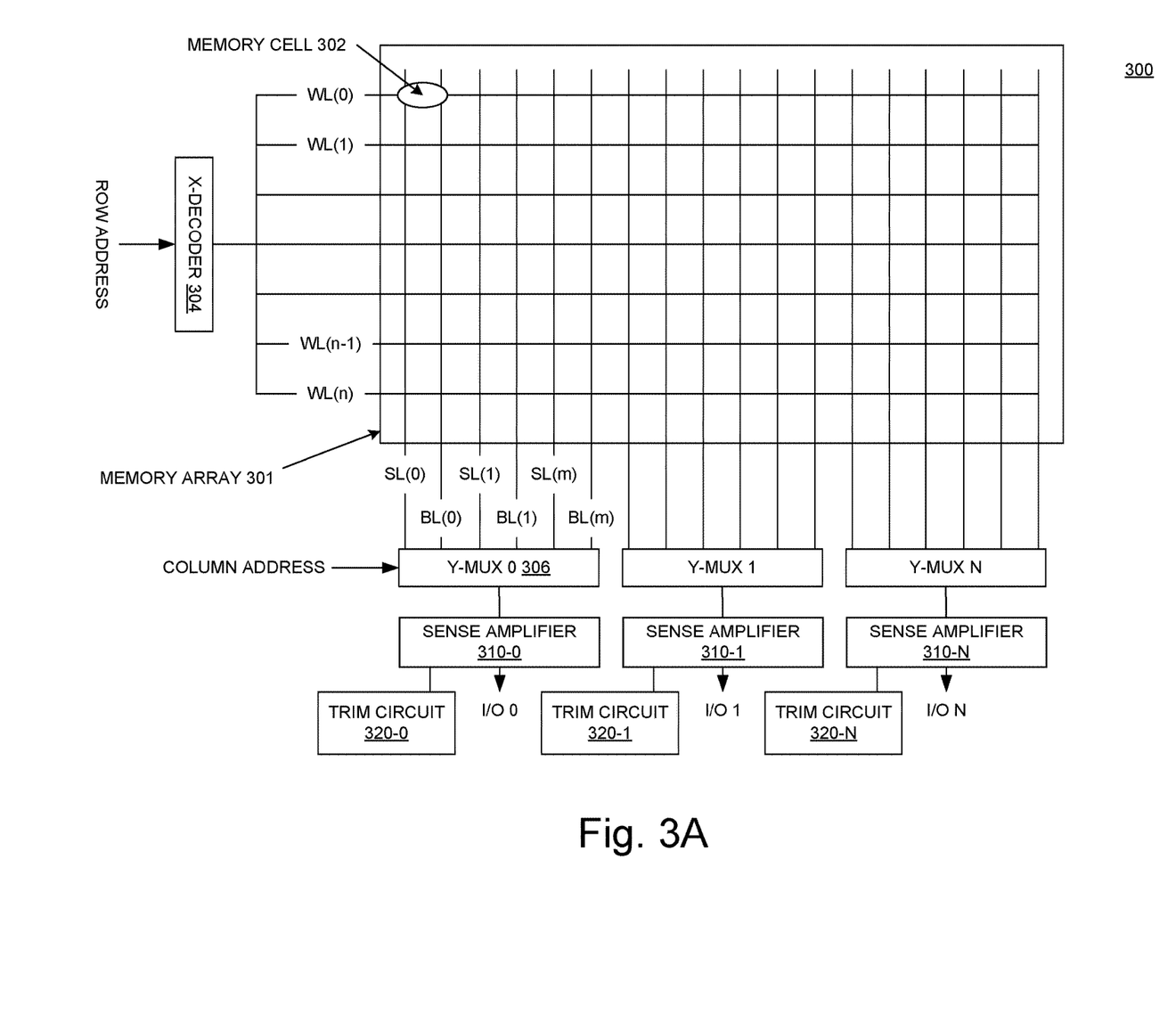
FIG. 3A illustrates a memory array in a memory device in embodiments according to the present invention.

FIG. 3A illustrates a memory array 301 in a memory device 300 in embodiments according to the present invention. In embodiments, the memory device 300 is a magnetoresistive random access memory (MRAM) device. In an embodiment, the memory device 300 is a spin transfer torque (STT-MRAM) device.

The memory array 301 includes a number of memory cells or storage elements exemplified by the memory cell 302. As just noted, the memory cell 302 may be an MRAM cell. In embodiments, an MRAM cell includes a magnetic tunnel junction (MTJ).

The memory device 300 includes a number of word lines exemplified by the word lines WL(0), WL(1), . . . , WL(n), a number of bit lines exemplified by BL(0), BL(1), . . . , BL(m), and a number of source lines exemplified by SL(0), SL1(1), . . . , SL(m). Not all memory cells, word lines, bit lines, and source lines are shown in the figure. The bit lines may also be referred to herein as input/output lines.

The memory cell 302 is at the intersection of a particular word line, bit line, and source line. The memory cell 302 is individually addressable using a row address, which specifies the particular word line, and a column address, which specifies the particular bit line. The memory device 300 includes an x-decoder block 304 that decodes a row address signal and supplies a signal to the corresponding word line. The memory device 300 also includes a number of y-multiplexers (y-muxes) exemplified by the y-mux 306. The y-muxes provide column select logic for selecting a bit line and source line corresponding to a column address signal. A number of memory cells are typically addressed together to form a data word.

The memory device 300 also includes a number of sense amplifiers 310-0, 310-1, . . . , 310-N, collectively referred to herein as the sense amplifiers 310. Each of the sense amplifiers 310 is coupled to a respective set of the input/output lines (set of bit lines) through a respective y-mux as shown in FIG. 3A. Each sense amplifier can receive a voltage from a respective input/output line (bit line), specifically an input/output line (bit line) corresponding to the memory cell being read (the addressed memory cell). The voltage has a first level if a bit value of the addressed memory cell has a first binary value, and has a second level if the bit value of the addressed memory cell has a second binary value. Each sense amplifier also can receive a respective reference bit line voltage that allows the sense amplifier to sense the bit value of the addressed memory cell. Each sense amplifier 0, 1, N outputs a respective output (I/O) value (bit value) I/O 0, I/O 1, . . . , I/O N.

Significantly, in embodiments according to the present invention, the memory device 300 also includes a number of circuits 320-0, 320-1, . . . , 320-N collectively referred to herein as trim circuits 320. Each of the trim circuits 320 is associated with and coupled to a respective one of the sense amplifiers 310. That is, there is a different trim circuit for each sense amplifier.

As described further below, each of the trim circuits 320 compensates for variations in the respective bit line reference voltage received by the corresponding one of the sense amplifiers 310. That is, the trim circuits 320 are operable to individually correct variations in the reference bit line voltages respectively supplied to the sense amplifiers 310, and each trim circuit is operable to maintain the respective reference bit line voltage between a first voltage level (the voltage level associated with a bit value of 1) and a second voltage level (the voltage level associated with a bit value of 0), as shown in FIG. 3B.

Figure 3B:
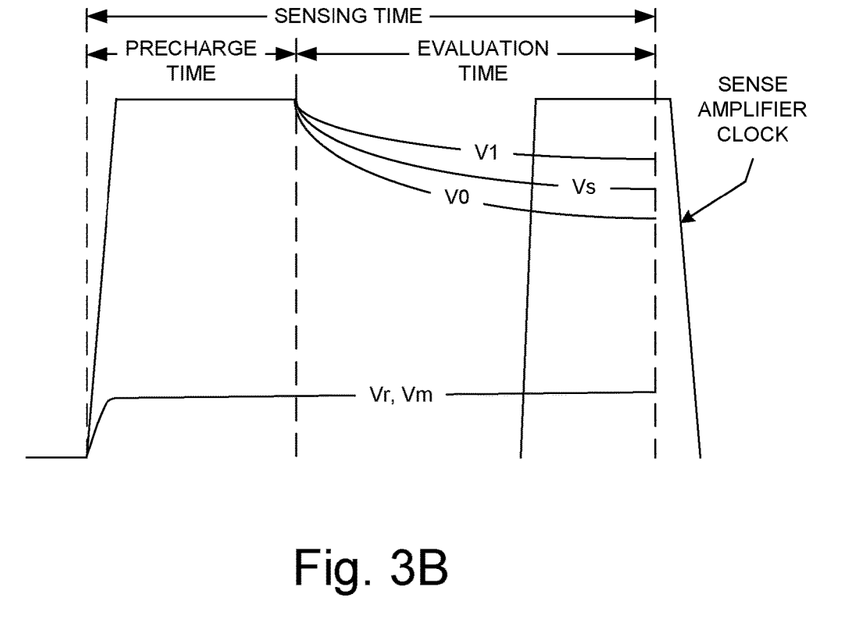
FIG. 3B illustrates an example of voltages versus time for a read operation in embodiments according to the present invention.

FIG. 3B illustrates an example of voltages versus time for a read operation in embodiments according to the present invention. For example, the trim circuit 320-N compensates for variations in the reference voltage received by the sense amplifier 310-N. As a result, during the clock period of the sense amplifier 310-N, there is no mismatch between the main and reference bit line voltages and the reference bit line voltage supplied to the sense amplifier (Vs) is between the voltage (V1) that corresponds to a bit value of 1 and the voltage (V0) that corresponds to a bit value of 0. Thus, the sense amplifier 310-N will sense the proper bit value.

Co-pending U.S. patent application Ser. No. 15/858,398, entitled "Multi-Port Random Access Memory," by Mourad El Baraji et al., is hereby incorporated by reference in its entirety. That application describes a multi-port memory device that can access two or more memory cells at the same time. Embodiments according to the present disclosure can be utilized with and/or in a multi-port memory device as disclosed in the referenced application.

Figure 4:
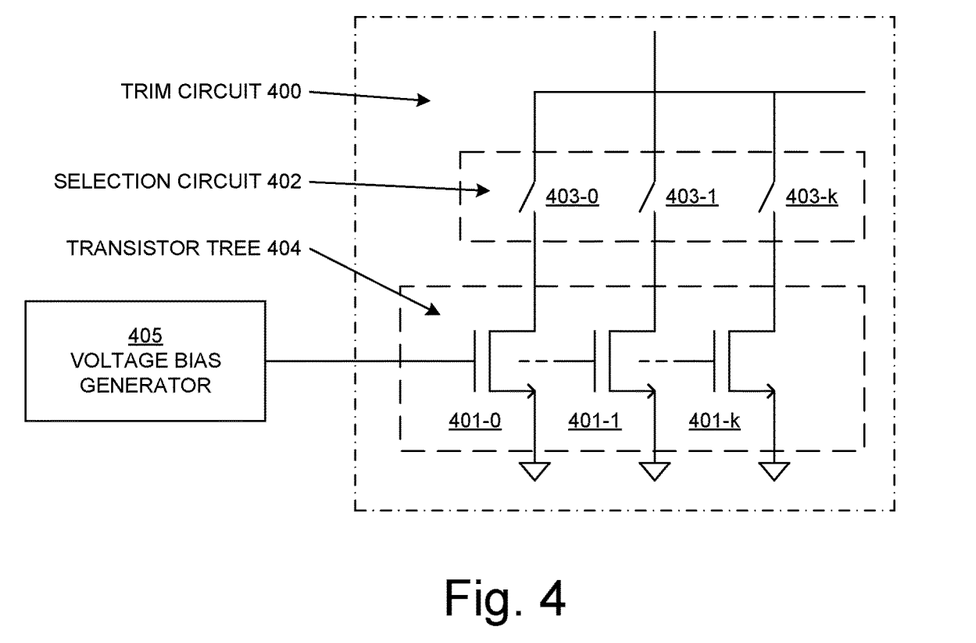
FIG. 4 illustrates an embodiment of a trim circuit according to the present invention.

FIG. 4 illustrates a trim circuit 400 in embodiments according to the present invention. In some embodiments, each of the trim circuits 320 of FIG. 3A is implemented using the trim circuit 400. In other embodiments, each of the trim circuits 320 is implemented using the trim circuit 700 of FIG. 7, described further below.

The transistor tree 404 of FIG. 4 includes a number of transistors 401-0, 401-1, . . . , 401-k, collectively referred to herein as the transistors 401. In an embodiment, the sizes of the transistors differ from each other by a factor of two. Thus, for example, the transistor 401-1 is twice the size of the transistor 401-0, the transistor 401-2 (not shown) is twice the size of the transistor 401-1, and so on.

The transistors 401 receive a reference voltage from a voltage bias generator 405. The transistors 401 are coupled to a selection circuit 402. In general, as described further in conjunction with FIGS. 5 and 6 below, the selection circuit 402 is operable for selectively coupling and decoupling one or more of the transistors 401 to and from a respective reference bit line.

In an embodiment, the selection circuit 402 of FIG. 4 includes a number of switches 403-0, 403-1, . . . , 403-k, collectively referred to herein as the switches 403. The switches 403 can be implemented as transistors. Each of the transistors 401 is coupled to a respective one of the switches 403. Each of the switches 403 is controlled by a respective program value or configuration bit. If the configuration bit has a first binary value, then the switch is closed (enabled), and the switch is opened (disabled) if the configuration bit has a second binary value. Each of the transistors 401 is also coupled to a respective ground.

When a transistor in the transistor tree 404 is coupled to a respective reference bit line or respective bit line bias line (see FIGS. 5 and 6) by closing the associated one of the switches 403, a corresponding amount of current is trimmed (drained) from that line through the transistor to ground. As noted above, one or more of the transistors may be coupled to the line at a time. As described above, in an embodiment, the transistors 401 have different sizes. Thus, the amount of the trimmed current can be finely controlled by selecting a single one of the transistors (a single desired size) or any combination of the transistors (any desired combination of sizes).

In general, the program values used to configure the trim circuit 400 (FIG. 4) are determined by measuring the reference bit line voltage respectively supplied to each of the sense amplifiers 320 (FIG. 3A) and then determining the program values that will cause each respective reference bit line voltage to be in the range between the voltage for a binary value of 1 and the voltage for a binary value of 0. Ideally, each reference bit line voltage supplied to a sense amplifier is at about the midpoint of that range.

The program values used to control the switches 403 (FIG. 4) can be determined, for example, when the memory device 300 (FIG. 3A) is manufactured, and/or when the memory device is installed in a computing system, and/or each time the memory device is powered up. Alternatively, after installation, testing of the memory device 300 can be periodically performed and the program values can be determined accordingly.

Because a respective trim circuit is coupled to each sense amplifier, each trim circuit can be individually tuned. That is, the program values can be different for each of the trim circuits 400 of FIG. 4. Thus, the reference bit line voltage for each of the sense amplifiers 320 (FIG. 3A) can be individually trimmed, as opposed to global trimming of all sense amplifiers.

Figure 5:
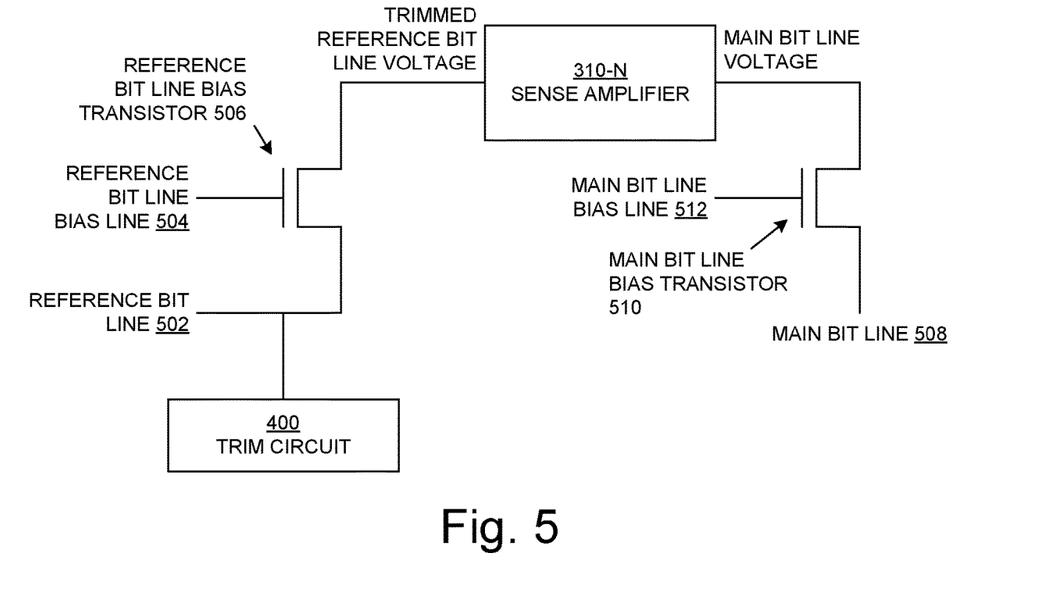
FIG. 5 illustrates a trim circuit coupled to a reference bit line in embodiments according to the present invention.

FIG. 5 illustrates a trim circuit 400 coupled to a reference bit line 502 in an embodiment according to the present invention. The sense amplifier 310-N is coupled to receive a reference bit line voltage from the reference bit line 502, which is connected to the sense amplifier through a reference bit line bias transistor 506. A reference bit line bias line 504 is connected to the gate of the reference bit line bias transistor 506. As described above, the trim circuit 400 is configured to trim a selected amount of current on the reference bit line 502 to compensate for variations in the reference bit line, so that a trimmed reference bit line voltage is supplied to the sense amplifier 310-N.

The sense amplifier 310-N is also coupled to receive a main bit line voltage from the main bit line 508, which is connected to the sense amplifier through a main bit line bias transistor 510. A main bit line bias line 512 is connected to the gate of the main bit line bias transistor 510. The main bit line voltage is the voltage on the bit line of the memory cell being read (the addressed memory cell). The sense amplifier 310-N can compare the main bit line voltage and the trimmed reference bit line voltage to determine the bit value of the memory cell being read.

Figure 6:
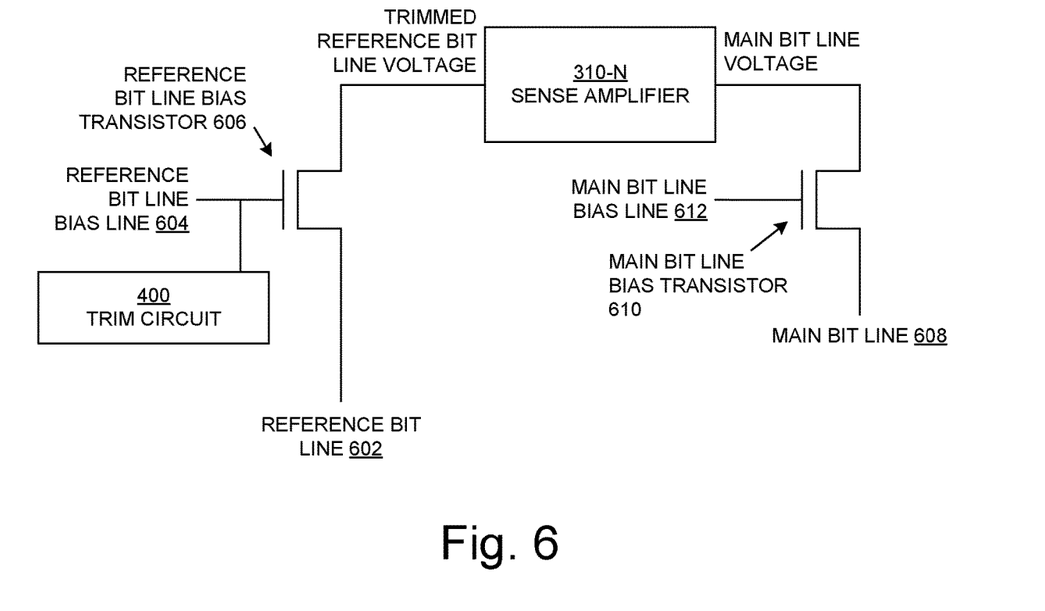
FIG. 6 illustrates a trim circuit coupled to a bit line bias line in embodiments according to the present invention.

FIG. 6 illustrates a trim circuit 400 coupled to a bit line bias line 604 in an embodiment according to the present invention. A reference bit line bias line 604 is connected to the gate of the reference bit line bias transistor 606 that is coupled to the reference bit line 602, which is coupled to the sense amplifier 310-N. As described above, the trim circuit 400 is configured to trim a selected amount of the current on the reference bit line bias line 604 to compensate for variations in the reference bit line 602, so that a trimmed reference bit line voltage is supplied to the sense amplifier 310-N. More specifically, the float on the reference bit line bias transistor 606 is adjusted to provide a different bias for the reference bit line 602 and trim the reference bit line voltage supplied to the sense amplifier 310-N.

The sense amplifier 310-N is also coupled to receive a main bit line voltage from the main bit line 608, which is connected to the sense amplifier through a main bit line bias transistor 610. A main bit line bias line 612 is connected to the gate of the main bit line bias transistor 610. The main bit line voltage is the voltage on the bit line of the memory cell being read (the addressed memory cell). The sense amplifier 310-N can compare the main bit line voltage and the trimmed reference bit line voltage to determine the bit value of the memory cell being read.

Figure 7:
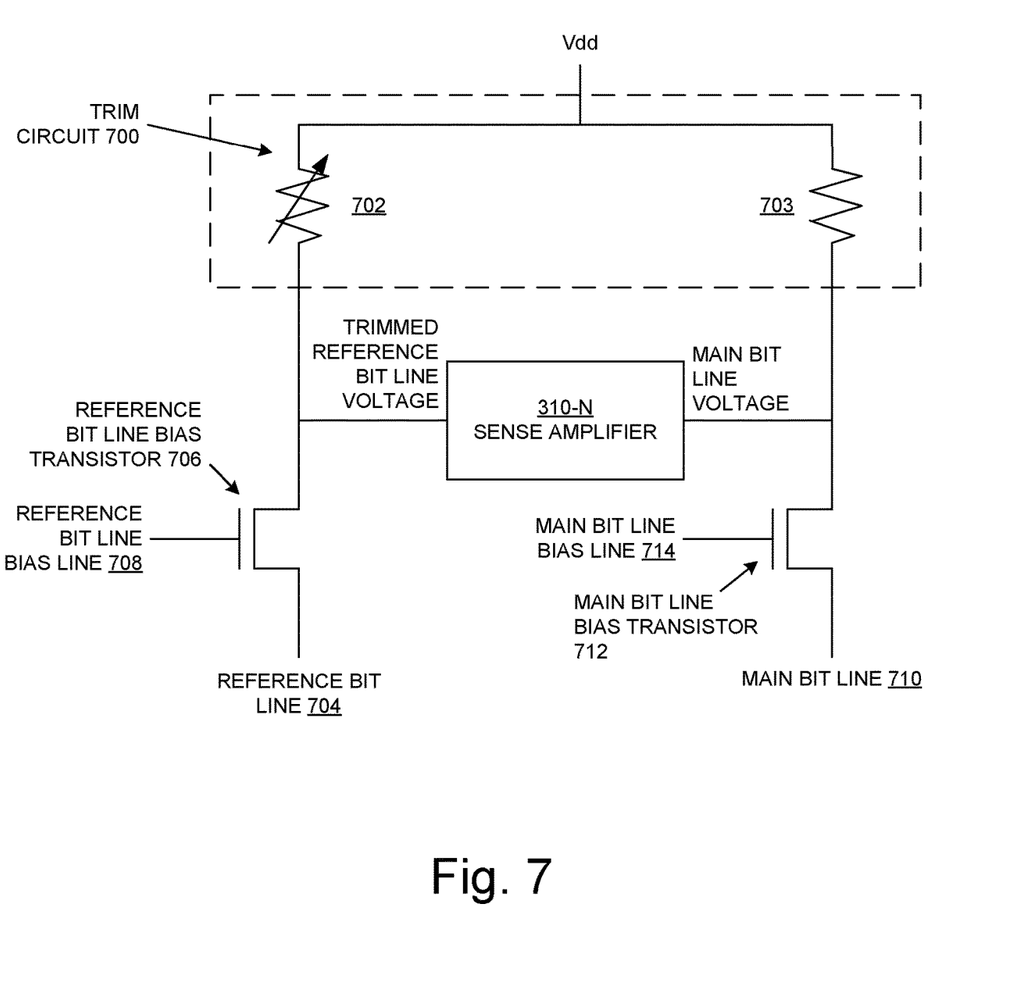
FIG. 7 illustrates another embodiment of a trim circuit according to the present invention.

FIG. 7 illustrates a trim circuit 700 in another embodiment according to the present invention. As mentioned above, in some embodiments, each of the trim circuits 320 of FIG. 3A is implemented using the trim circuit 700. The trim circuit 700 includes a variable resistor 702 coupled to the reference bit line 704 and to supply voltage Vdd. The trim circuit 700 also includes a resistor 703 coupled between the supply voltage Vdd and the main bit line 710. The current on the reference bit line 702 can be trimmed using the trim circuit 700, by varying the resistances of the variable resistor 702, so that a trimmed reference bit line voltage is supplied to the sense amplifier 310-N.

The reference bit line 704 is coupled to the trim circuit 700 and to the sense amplifier 310-N through a reference bit line bias transistor 706. A reference bit line bias line 708 is connected to the gate of the reference bit line bias transistor 706.

The variable resistor 702 can be implemented using a digital potentiometer, or digitally controlled variable resistor, that is controlled by program values or configuration bits in a manner similar to that described above for the trim circuit 400. The program values used to control the variable resistor 702 can be determined, for example, when the memory device 300 (FIG. 3A) is manufactured, and/or when the memory device is installed in a computing system, and/or each time the memory device is powered up. Alternatively, after installation, testing of the memory device 300 can be periodically performed and the program values can be determined accordingly.

The sense amplifier 310-N is also coupled to receive a main bit line voltage from the main bit line 710, which is connected to the sense amplifier through a main bit line bias transistor 712. A main bit line bias line 714 is connected to the gate of the main bit line bias transistor 712. The main bit line 710 is also coupled to the trim circuit 700. The main bit line voltage is the voltage on the bit line of the memory cell being read (the addressed memory cell). The sense amplifier 310-N can compare the main bit line voltage and the trimmed reference bit line voltage to determine the bit value of the memory cell being read.

Figure 8:
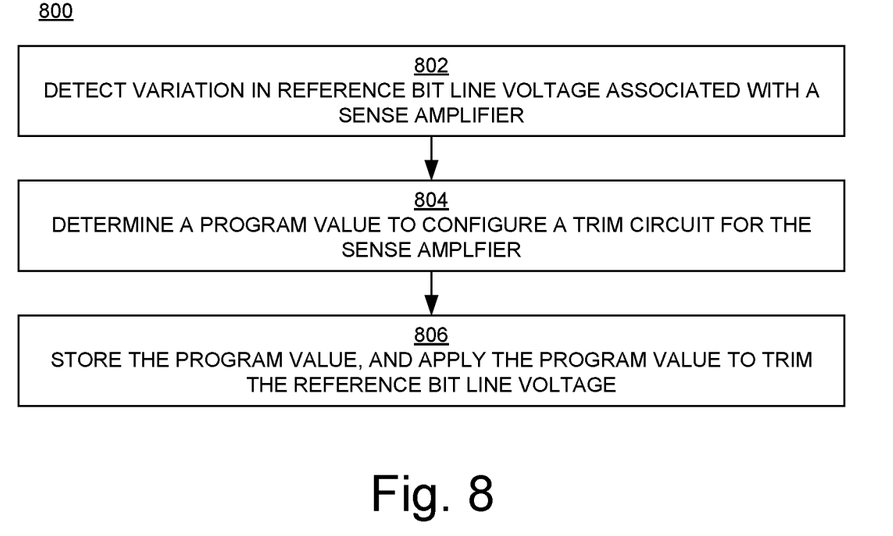
FIG. 8 is a flowchart of examples of operations in a method for configuring a trim circuit in embodiments according to the present invention.

FIG. 8 is a flowchart 800 of examples of operations in a method for configuring a trim circuit in embodiments according to the present invention. The operations can be performed in and by the computing system 900 of FIG. 9. The computing system 900 can include the memory device 300 of FIG. 3A or can be coupled to the memory device. The operations in the flowchart 800 can be performed, for example, by a tester system when the memory device 300 is manufactured, and/or when the memory device is installed, and/or each time the memory device is powered up, and/or each time the memory device is tested. The operations in the flowchart 800 can be performed for each of the sense amplifiers 310 of FIG. 3A.

In block 802 of FIG. 8, a variation of a reference bit line voltage associated with a sense amplifier, that places the associated reference bit line voltage outside a range of voltage values, is detected.

In block 804, a respective program value or configuration bit to configure a respective programmable trim circuit (e.g., the trim circuit 400 or the trim circuit 700 of FIGS. 4 and 7, respectively) to compensate for the variation is determined.

In block 806, the respective program value is non-volatilely stored. The respective program value, when applied to configure the respective programmable trim circuit, causes the associated reference bit line voltage to be within the range of voltage values.

For implementations using the trim circuit 400 of FIG. 4 implemented as shown in FIG. 5, the respective program value is applied to select a number of transistors to be coupled to a reference bit line coupled to the respective sense amplifier through a respective bit line bias transistor. For implementations using the trim circuit 400 of FIG. 4 implemented as shown in FIG. 6, the respective program value is applied to select a number of transistors to be coupled to a bit line bias line coupled to a respective bit line bias transistor coupled to a respective reference bit line that is coupled to the respective sense amplifier.

For implementations using the trim circuit 700 of FIG. 7, the respective program value is applied to select an amount of resistance to be applied to a reference bit line coupled to the respective sense amplifier.

Figure 9:
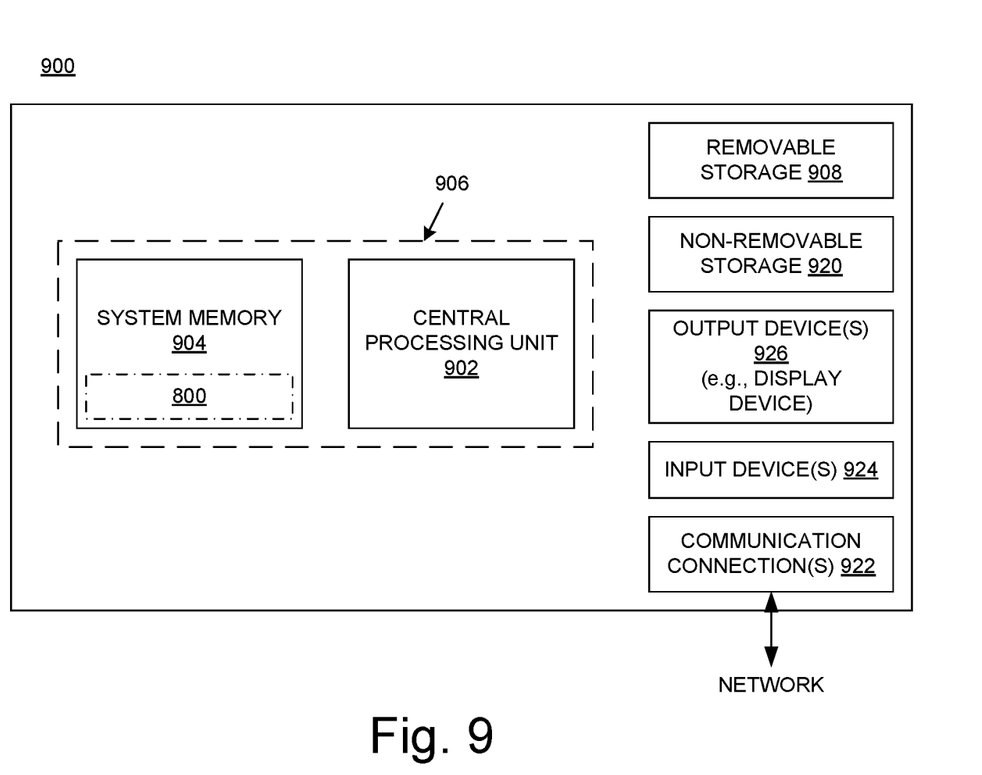
FIG. 9 is an example of a computing system upon which embodiments according to the present invention can be implemented.

FIG. 9 is an example of a computing system 900 upon which embodiments according to the present invention can be implemented. In its most basic configuration, the system 900 includes at least one processing unit 902 and memory 904. This most basic configuration is illustrated in FIG. 9 by dashed line 906. The system 900 may also have additional features and/or functionality. For example, the system 900 may also include additional storage (removable and/or non-removable) including, but not limited to, magnetic or optical disks or tape. Such additional storage is illustrated in FIG. 9 by removable storage 908 and non-removable storage 920. The system 900 may also contain communications connection(s) 922 that allow the device to communicate with other devices, e.g., in a networked environment using logical connections to one or more remote computers.

The system 900 can also include input device(s) 924 such as keyboard, mouse, pen, voice input device, touch input device, etc. Output device(s) 926 such as a display device, speakers, printer, etc., are also included.

In the example of FIG. 9, the memory 904 includes computer-readable instructions, data structures, program modules, and the like associated with an application for executing a method for configuring a trim circuit in embodiments according to the present invention (e.g., the method of FIG. 8). For example, in an embodiment, the system 900 can include a tester system that can be connected to a memory device that includes a trim circuit (e.g., the memory device 300 of FIG. 3).

Thus, in embodiments according to the present invention, a trim circuit per sense amplifier is used to compensate for variations in the respective reference bit line voltage supplied to the sense amplifier. As a result, the reference bit line voltage supplied to each sense amplifier is maintained between the voltage associated with a bit value of 1 and the voltage associated with a bit value of 0. Mismatches between sense amplifiers are thereby compensated for or precluded. Consequently, the accuracy and reliability of read operations are increased. Specifically, erroneous reads due to mismatches in circuit parameters and variations in the reference bit line voltages are reduced in number if not completely eliminated, even when the sensing margin is small as it is for MTJ devices in MRAM arrays.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The example methods described and/or illustrated herein may also omit one or more of the steps described or illustrated herein or include additional steps in addition to those disclosed.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), magnetoresistive random access memory (MRAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Embodiments according to the present invention are thus described. While the present invention has been described in particular embodiments, it should be appreciated that the present invention should not be construed as limited by such embodiments, but rather construed according to the following claims.

What is claimed is:

1. A device, comprising:
an array of memory cells that are individually addressable;
a plurality of input/output lines coupled to the memory cells;
a plurality of sense amplifiers coupled to the input/output lines, wherein each sense amplifier of the plurality of sense amplifiers is associated with and coupled to a respective input/output line of the plurality of input/output lines; and
a plurality of trim circuits, wherein each trim circuit of the plurality of trim circuits is associated with and coupled to a respective sense amplifier of the plurality of sense amplifiers, and wherein said each trim circuit is further coupled to receive a respective reference voltage that allows said each sense amplifier to sense a binary value of an addressed memory cell of the array of memory cells, wherein further said each trim circuit is individually configured with a respective program value to tune the respective reference voltage to a level that is within a first voltage corresponding to a first binary value and a second voltage corresponding to a second binary value, and wherein said each trim circuit comprises a plurality of transistors coupled to a ground and selectively coupled to a line coupled to the respective sense amplifier according to the respective program value.

2. The device of claim 1, further comprising a selection circuit coupled to the plurality of transistors and operable for selectively coupling one or more of the transistors to the line and for selectively decoupling one or more of the transistors from the line according to the respective program value.

3. The device of claim 1, wherein the plurality of transistors comprises transistors having sizes that differ from each other by a factor of two.

4. The device of claim 1, wherein the line comprises a reference bit line coupled to the respective sense amplifier through a bit line bias transistor.

5. The device of claim 1, wherein the line comprises a bit line bias line coupled to a bit line bias transistor coupled to a reference bit line coupled to the respective sense amplifier.

6. The device of claim 1, wherein said each trim circuit comprises a variable resistor coupled to a supply voltage and coupled to a reference bit line coupled to the respective sense amplifier, wherein the variable resistor is controlled by the respective program value.

7. The device of claim 1, wherein the memory cells comprise magnetoresistive random access memory (MRAM) cells, wherein the MRAM cells comprise magnetic tunnel junctions (MTJs).

8. A device, comprising:
an array of magnetoresistive random access memory (MRAM) cells, wherein the MRAM cells comprise magnetic tunnel junctions (MTJs);
a plurality of input/output lines coupled to the MRAM cells;
a plurality of sense amplifiers coupled to the input/output lines, wherein each sense amplifier of the plurality of sense amplifiers is configured to receive a voltage from a respective input/output line, the voltage having a first level if a bit value of an addressed memory cell of the MRAM cells has a first binary value and having a second level if the bit value of the addressed memory cell has a second binary value, said each sense amplifier further coupled to receive a respective reference bit line voltage of a plurality of reference bit line voltages; and
a plurality of trim circuits coupled to the sense amplifiers, wherein each trim circuit of the plurality of trim circuits is configured according to a respective program value to maintain a reference voltage at the respective sense amplifier between the first level and the second level, wherein said each trim circuit is associated with a respective sense amplifier of the plurality of sense amplifiers that are operable for detecting a variation of the respective reference bit line voltage that places the associated reference bit line voltage outside a range of voltage values.

9. The device of claim 8, wherein said each trim circuit comprises a plurality of transistors coupled to a ground and selectively coupled to a line coupled to the respective sense amplifier according to the respective program value.

10. The device of claim 9, further comprising a selection circuit coupled to the plurality of transistors and operable for selectively coupling one or more of the transistors to the line and for selectively decoupling one or more of the transistors from the line according to the respective program value.

11. The device of claim 9, wherein the plurality of transistors comprises transistors having sizes that differ from each other by a factor of two.

12. The device of claim 9, wherein the line comprises a reference bit line coupled to the respective sense amplifier through a bit line bias transistor.

13. The device of claim 9, wherein the line is coupled to a bit line bias transistor coupled to a reference bit line coupled to the respective sense amplifier.

14. The device of claim 8, wherein said each trim circuit comprises a variable resistor coupled to a supply voltage and coupled to a reference bit line coupled to the respective sense amplifier, wherein the variable resistor is controlled by the respective program value.

15. A method, comprising:
for each sense amplifier of a plurality of sense amplifiers coupled to a memory array, wherein said each sense amplifier is associated with i) a respective input/output line of a plurality of input/output lines and ii) a respective reference bit line voltage that allows said each sense amplifier to sense a binary value of an addressed memory cell of the memory array, and wherein said each sense amplifier is coupled to a respective programmable trim circuit of a plurality of programmable trim circuits:
receiving the respective bit line reference voltage;
detecting a variation of the respective reference bit line voltage that places the respective reference bit line voltage outside a range of voltage values; and
in response to said detecting, configuring the respective programmable trim circuit according to a respective program value to tune the respective reference bit line voltage to a level that is within a first voltage corresponding to a first binary value and a second voltage corresponding to a second binary value.

16. The method of claim 15, wherein the respective programmable trim circuit comprises a plurality of transistors coupled to a ground and selectively coupled to a line coupled to the respective sense amplifier, wherein the method further comprises applying the respective program value to select a number of the transistors to be coupled to the line, wherein the line is selected from the group consisting of: a reference bit line coupled to the respective sense amplifier through a bit line bias transistor, and a bit line bias line coupled to a bit line bias transistor coupled between a reference bit line and the respective sense amplifier.

17. The method of claim 15, wherein the respective programmable trim circuit comprises a variable resistor coupled to a supply voltage and coupled to a line coupled to the respective sense amplifier, wherein the method further comprises applying the respective program value to select an amount of resistance to be applied to the line, wherein the line is a reference bit line coupled to the respective sense amplifier.

18. The method of claim 15, wherein the memory array comprises magnetoresistive random access memory (MRAM) cells, wherein the MRAM cells comprise magnetic tunnel junctions (MTJs).

* * * * *